US006707368B2

(12) United States Patent
Alfaro et al.

(10) Patent No.: US 6,707,368 B2
(45) Date of Patent: Mar. 16, 2004

(54) MANUALLY TRIPPABLE CIRCUIT BREAKER

(75) Inventors: Conrad Fresco Alfaro, Bolingbrook, IL (US); Thomas James Stack, Chicago, IL (US)

(73) Assignee: Cooper Technologies Company, Houston, TX (US)

( * ) Notice: Subject to any disclaimer, the term of this patent is extended or adjusted under 35 U.S.C. 154(b) by 0 days.

(21) Appl. No.: 10/198,464

(22) Filed: Jul. 17, 2002

(65) Prior Publication Data

US 2003/0048160 A1 Mar. 13, 2003

Related U.S. Application Data

(60) Provisional application No. 60/306,258, filed on Jul. 18, 2001.

(51) Int. Cl.[7] .......................... H01L 71/16; H01L 71/58

(52) U.S. Cl. ............................. 337/56; 337/66; 337/72; 337/91; 337/348; 200/341; 200/520

(58) Field of Search ........................ 337/3, 131, 36–38, 337/41, 53, 56, 62, 63, 66, 68, 72, 76, 85, 86, 91, 111, 112, 133, 158, 333, 348, 357–359; 200/339, 341, 401, 402, 407, 520–546

(56) References Cited

U.S. PATENT DOCUMENTS

| | | | | | |
|---|---|---|---|---|---|
| 3,311,725 | A | * | 3/1967 | Butler et al. | 337/343 |
| 4,068,203 | A | * | 1/1978 | Unger | 337/56 |
| 4,123,737 | A | * | 10/1978 | Hoagland, Jr. | 337/68 |
| 4,363,016 | A | * | 12/1982 | Unger | 337/56 |
| 4,379,278 | A | * | 4/1983 | Kuczynski et al. | 337/91 |
| 4,518,943 | A | * | 5/1985 | Giessner | 337/68 |
| 4,528,538 | A | * | 7/1985 | Andersen | 337/43 |
| 4,573,031 | A | * | 2/1986 | Krasser | 337/68 |
| 4,667,175 | A | * | 5/1987 | Sell | 337/68 |
| 4,682,138 | A | * | 7/1987 | Sell | 337/68 |
| 4,801,913 | A | * | 1/1989 | Weber et al. | 337/66 |
| 4,803,455 | A | * | 2/1989 | Kuczynski | 337/68 |
| 4,814,739 | A | * | 3/1989 | Moldovan | 337/68 |
| 4,868,535 | A | * | 9/1989 | Janniere et al. | 337/68 |
| 5,001,450 | A | * | 3/1991 | Wu | 337/68 |
| 5,004,994 | A | | 4/1991 | Korczynski et al. | |
| 5,021,761 | A | | 6/1991 | Stack et al. | |
| 5,248,954 | A | * | 9/1993 | Chiang | 337/66 |
| 5,453,725 | A | * | 9/1995 | You et al. | 337/68 |
| 5,694,106 | A | * | 12/1997 | Wang | 337/79 |
| 5,742,219 | A | * | 4/1998 | Moalem et al. | 337/68 |
| 6,563,414 | B2 | * | 5/2003 | Yu | 337/66 |

FOREIGN PATENT DOCUMENTS

DE 19856707 A1 6/2000

OTHER PUBLICATIONS

European Search Report, Apr. 10, 2002, Appln. No. EP02102035.9–1231, Cooper Technologies Company.

DE198 56 707 A1, Sep. 12, 1998, Elenberger & Poensgen GmbH, 90518 Altdorf. DE.

E–T–A Thermal Automotive Circuit Breaker 1170, Issue B, Jan. 31, 2001, www.etacbe.com.

* cited by examiner

*Primary Examiner*—Anatoly Vortman
(74) *Attorney, Agent, or Firm*—Armstrong Teasdale LLP

(57) ABSTRACT

A circuit breaker includes a nonconductive housing, a first breaker contact within said housing, and a trigger element having a second breaker contact located within said housing. The trigger element is thermally activated to separate the first and second breaker contacts in an overcurrent condition. A nonconductive reset mechanism is located in the housing and configured for sliding actuation to prevent electrical connection between the first breaker contact and the second breaker contact after the trigger element has activated.

20 Claims, 7 Drawing Sheets

MANUALLY TRIPPABLE CIRCUIT BREAKER

CROSS REFERENCE TO RELATED APPLICATIONS

This application claims the benefit of U.S. Provisional Patent Application Serial. No. 60/306,258 filed Jul. 18, 2001.

BACKGROUND OF THE INVENTION

This invention relates generally to circuit breakers and, more particularly, to thermal circuit breakers.

Circuit breakers are electrical circuit protective devices that interrupt a flow of current when the current exceeds a specified value, sometimes referred to as an overcurrent value. In an overcurrent condition, the circuit breaker rapidly separates a pair of contacts that normally conduct the current. Circuit wiring and associated circuit components may therefore be isolated from potentially damaging and undesirable exposure to excess currents. Conventionally, circuit breakers are either thermally or magnetically actuated.

One type of known thermal circuit breaker includes a nonconductive housing with conductive line and load contact terminals therein for electrical connection to a circuit to be protected. A temperature responsive element, sometimes referred to as thermal trigger element, is extended across the line and load contacts, and when the breaker is connected to an energized circuit, current flows between the breaker contacts through the trigger element in normal operation. Current flow through the trigger element heats the trigger element, and when current flow exceeds a predetermined level, the trigger element trips, deflects, or deforms to an activated position separated from each of the breaker contacts, thereby breaking the current through the breaker and protecting load side electrical devices.

Additionally, some thermal circuit breakers include manual reset and manual trip features to interrupt the breaker circuit independently of thermal conditions. Implementing such features can lead to relatively complicated constructions that increase manufacturing and assembly costs of the breaker.

BRIEF DESCRIPTION OF THE INVENTION

In one aspect, a circuit breaker is provided comprising a nonconductive housing, a first breaker contact within said housing, and a trigger element comprising a second breaker contact located within said housing. The trigger element is thermally activated to separate said second breaker contact from said first breaker contact in an overcurrent condition. A nonconductive reset mechanism is located in said housing and configured for sliding actuation to prevent electrical connection between said first breaker contact and said second breaker contact after said trigger element has activated.

In another aspect, a circuit breaker is provided. The circuit breaker comprises a nonconductive housing, a first breaker contact within said housing, and a trigger element comprising a second breaker contact located within said housing. The trigger element is thermally activated to separate said second breaker contact from said first breaker contact in an overcurrent condition. A nonconductive reset element is located in said housing and configured for sliding actuation to prevent electrical connection between said first breaker contact and said second breaker contact after said trigger element has activated, and a manual trip element comprises opposite legs pivotally mounted to said housing. The opposite legs of the manual trip element contact said trigger element and separate said first and second breaker contact when said trip element is pivoted.

In another aspect, a circuit breaker comprises a nonconductive housing and first and second terminal blades extending from said housing. A first breaker contact is located within said housing and is in electrical contact with said first blade terminal. A trigger element comprises a second breaker contact located within said housing, and the second breaker contact is in electrical contact with said second blade terminal. The trigger element is thermally activated to separate said second breaker contact from said first breaker contact in an overcurrent condition. A reset element comprises opposite legs in sliding engagement with said first and second blade terminals and a nonconductive portion extending between said opposite legs. The nonconductive portion is positionable between said first breaker contact and said second breaker contact to prevent electrical connection therebetween after said trigger element has activated. A manual trip element comprises opposite legs and a cross member therebetween, and the legs are pivotally mounted to said housing. The trip element legs contact the trigger element and separate the first and second breaker contacts when said manual trip element is pivoted.

DETAILED DESCRIPTION OF THE INVENTION

Figure 1:
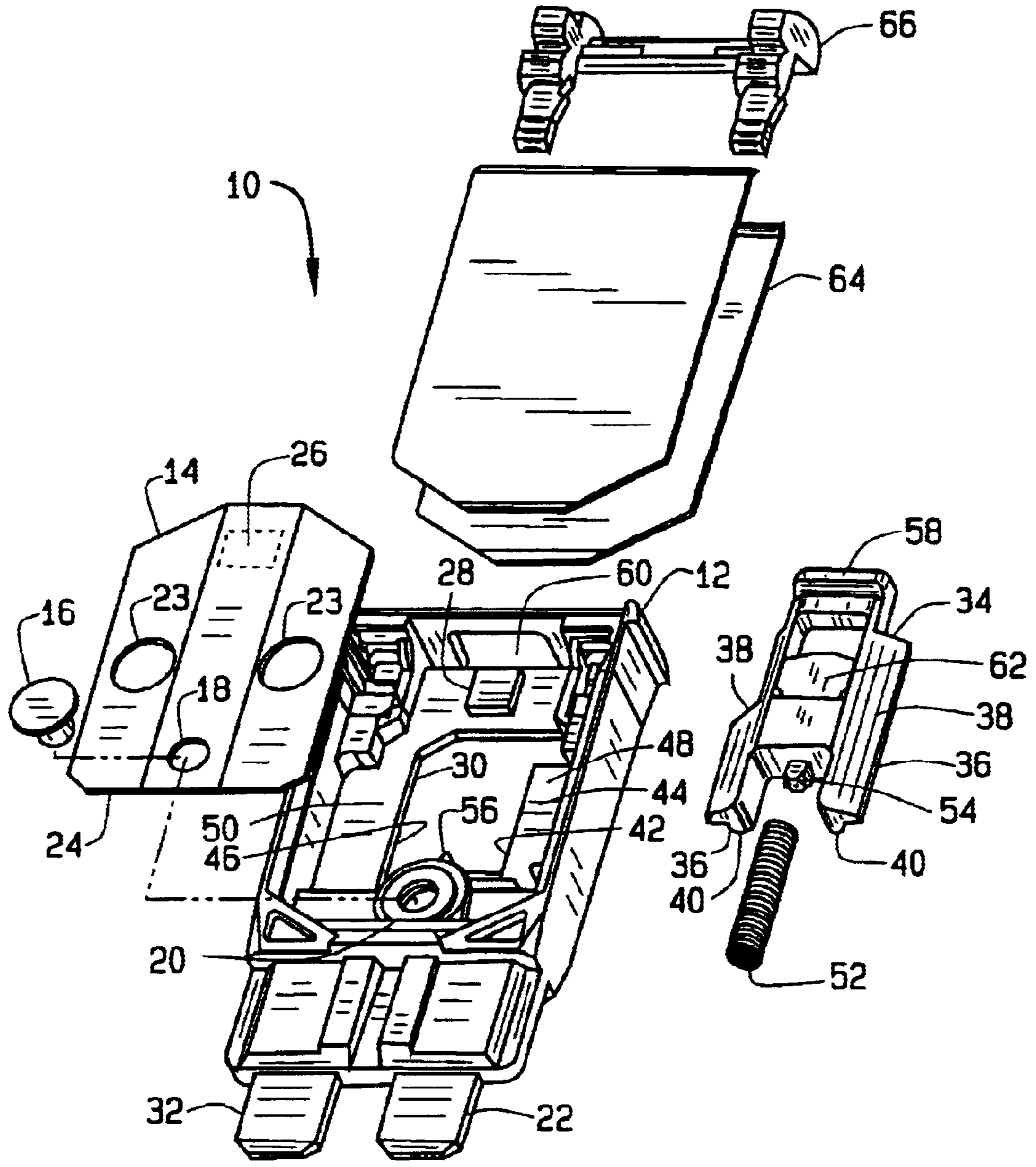
FIG. 1 is an exploded view of a circuit breaker according to the present invention.

FIG. 1 is an exploded view of a circuit breaker 10 according to the present invention. It is recognized, however, that circuit breaker 10 is but one embodiment of circuit breakers in which the benefits of the invention may be appreciated. Thus the description set forth below is for illustrative purposes only, and it is contemplated that the benefits of the invention accrue to various sizes and types of circuit breakers. Therefore, there is no intention to limit practice of the inventive concepts herein solely to the illustrative embodiment described, that is circuit breaker 10.

Circuit breaker 10 includes a housing 12 and a thermal trigger element therein. In an exemplary embodiment, the trigger element is a thermal material 14 fabricated from a metallic alloy, and a rivet 16 serves to attach thermal material 14 to housing 12. To attach thermal material 14 to housing 12, rivet 16 is inserted through a mounting aperture 18 in thermal material 14 and through a cylindrical receptacle 20, which is electrically conductive and molded into housing 12. Installation of rivet 16 to thermal material 14 and housing 12 establishes an electrical connection between thermal material 14 and cylindrical receptacle 20. Cylindrical receptacle 20 is also electrically connected to a first blade contact 22. In the embodiment shown, thermal material 14 further includes a number of indentations or dimples 23, further described below, which serve to accentuate a reaction of thermal material 14 to heat as current passes through material 14.

In operation, when breaker 10 is coupled to an energized circuit (not shown), current flows through first blade contact 22 to cylindrical receptacle 20 where it enters and continues to pass through thermal material 14. On an underside 24 of thermal material 14 there is an electrically and physically attached breaker contact 26. Attachment of thermal material 14 to housing 12 causes breaker contact 26 to physically touch a second breaker contact 28. The current passes from breaker contact 26 to second breaker contact 28, which is electrically connected to a circuit path 30 molded into housing 12. Current continues through circuit path 30 and exits through a second blade contact 32, which is electrically connected to circuit path 30. Current passes through contacts 26 and 28, as stated above, when breaker 10 is subjected to normal operating conditions. The direction of current described herein is by way of example only. Circuit breaker 10 is also operable when current enters at second blade contact 32 and exits at first blade contact 22.

The flow of current through thermal material 14 causes a heating of material 14. Circuit breaker 10, like conventional circuit breakers, is rated to withstand a predetermined current flow. If breaker 10 is subjected to a current flow which is in excess of the predetermined rated current, based upon selected dimensions and properties of thermal material 14, thermal material 14 is heated to an activation point where it will change its shape. The change in shape of material 14 causes breaker contacts 26 and 28 to separate, breaking the current flow through circuit breaker 10 and opening the associated electrical circuit to prevent damage to components and equipment coupled thereto. Current ratings for circuit breakers such as breaker 10 may be varied by adjustments to thermal material 14, for example, alloy composition and thickness of the material.

Circuit breaker 10 further includes a trip indicator/reset mechanism 34. Mechanism 34 is a molded plastic device which includes two legs 36. Legs 36 include an upper portion 38, which is molded to form a right angle with a side portion 40. Mechanism 34 is configured for reciprocating motion within housing 12 and rests within housing 12 with side portions 40 against a side 42 of guide 44 and a side 46 of circuit path 30, respectively. Upper portions 38 of legs 36 rest against an upper portion 48 of guide 44 and an upper portion 50 of circuit path 30. Once in place, legs 36 of mechanism 34 are configured to slide back and forth in a substantially linear movement along circuit path 30 and guide 44. A bias spring 52 is mounted between a protrusion 54 on mechanism 34 and a protrusion 56 on housing 12, and an indicating end 58 of mechanism 34 extends through an opening 60 in housing 12 when breaker contacts 26 and 28 are separated. A fiberglass insert 62 mounted in mechanism 34 serves to electrically isolate breaker contacts 26 and 28 when contacts 26 and 28 separate (based on a reaction of thermal material 14). To reset breaker 10, after thermal material 14 has cooled, indicating end 58 of mechanism 34 is pushed partially back into opening 60, against the bias of spring 52 and once fiberglass insert 62 has cleared breaker contacts 26 and 28, contacts 26 and 28 contact one another and lock fiberglass insert 62 beneath them. As a result spring 52 is compressed, ready to push mechanism 34 through opening 60, should contacts 26 and 28 again separate when thermal material 14 reaches the activation point.

In a further embodiment, isolating insert 62 is integrally formed with reset mechanism 34 in a monolithic piece in a known fabrication process, including but not limited to molding processes using nonconductive thermoset materials to fabricate reset mechanism 34.

Breaker 10 also includes a cover 64 which is placed over housing 12 to protect internal components of breaker 10 herein described, and a manual trip mechanism 66, which, as further described below, allows an external force to be applied to separate breaker contacts 26 and 28. In a further embodiment, cover 64 is embossed to provide added rigidity and structural strength.

Figure 2:
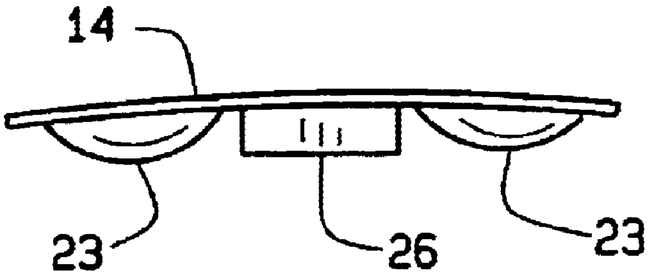
FIG. 2 is an end elevational view of a portion of the circuit breaker shown in FIG. 1.

FIG. 2 is an end elevational view of an exemplary embodiment of thermal material 14 used in circuit breaker 10 (shown in FIG. 1). It is recognized, however, that thermal material 14 is but one embodiment of thermal material used in circuit breakers in which the benefits of the invention may be appreciated. Thermal material 14 has an electrical contact 26 extending therefrom which provides a contact point to breaker contact 28 (shown in FIG. 1) as part of the current path through breaker 10 as above described. A mounting aperture 18 (shown in FIG. 1) allows mounting thermal material 14 to housing 12 of circuit breaker 10. As described above and shown in FIG. 2, thermal material 14 further includes dimples 23 pressed or formed into thermal material 14 which serve to accentuate reaction of thermal material 14 to heat which is generated as breaker current is conducted by thermal material 14. Thermal material 14 has a slightly convex shape, as illustrated in FIG. 2. In one embodiment, thermal material 14 is fabricated from a metal alloy which is configured to react to heat generated by current flow through thermal material 14. As circuit breaker 10 is exposed to a predetermined overcurrent condition, thermal material 14 is heated to an activation temperature wherein thermal material 14 reacts and assumes a concave shape. The reaction of thermal material 14, and the assumption of the concave shape causes breaker contact 26 to break electrical (and physical) contact with breaker contact 28 (shown in FIG. 1) located in housing 12 (shown in FIG. 1), thereby opening the protected circuit.

Figure 3:
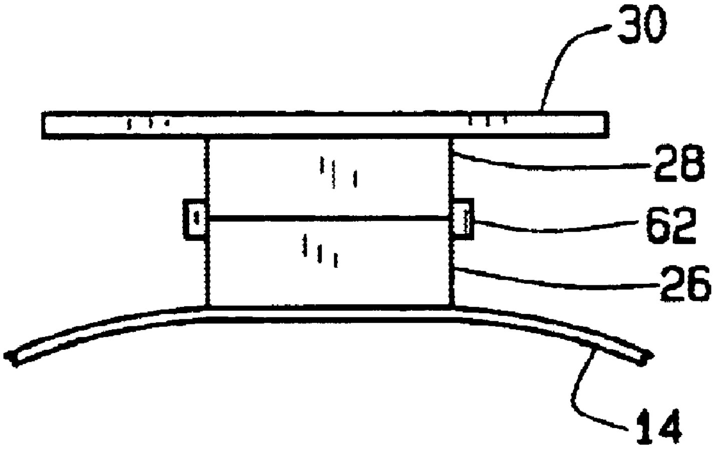
FIG. 3 illustrates a portion of the circuit breaker shown in FIG. 1 in a reset position.
Figure 4:
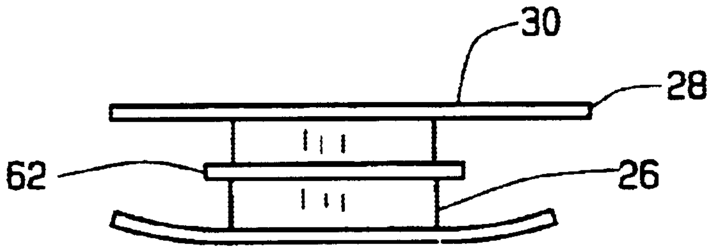
FIG. 4 illustrates a portion of the circuit breaker shown in FIG. 1 in a tripped position.

FIGS. 3 and 4 are cutaway views of breaker contacts 26 and 28 attached to thermal material 14 and circuit path 30 of housing 12 (shown in FIG. 1) respectively. Referring specifically to FIG. 3, breaker contacts 26 and 28 are physically and electrically connected, and thermal material 14 is in a convex reset position. In addition, fiberglass insert 62 of mechanism 34 (shown in FIG. 1) is in a position below breaker contacts 26 and 28. The convex position of thermal material 14, the position of fiberglass insert 62, and the contact of breaker contact 26 to second breaker contact 28 are indicative of normal current flow in a circuit.

FIG. 4 illustrates a result of an overcurrent condition to which circuit breaker 10 (shown in FIG. 1) has been exposed. Thermal material 14 has attained a temperature, resulting from excess current, which has caused thermal material 14 to activate and assume a concave trip position. Assumption of the concave position causes breaker contact 26 to separate from second breaker contact 28. In addition, and as described above, separation of breaker contacts 26 and 28 allow spring 52 (shown in FIG. 1) to uncompress, forcing mechanism 34 (shown in FIG. 1) to extend further into opening 60 of housing 12 (both shown in FIG. 1), placing fiberglass insert 62 between breaker contact 26 and 28, ensuring no current flow through circuit breaker 10 until breaker 10 is reset. Breaker 10 is reset by pushing indicating end 58 of mechanism 34 (both shown in FIG. 1) towards housing until breaker contacts 26 and 28 resume contact, with fiberglass insert 62 below contacts 26 and 28, as shown in FIG. 3

Figure 5:
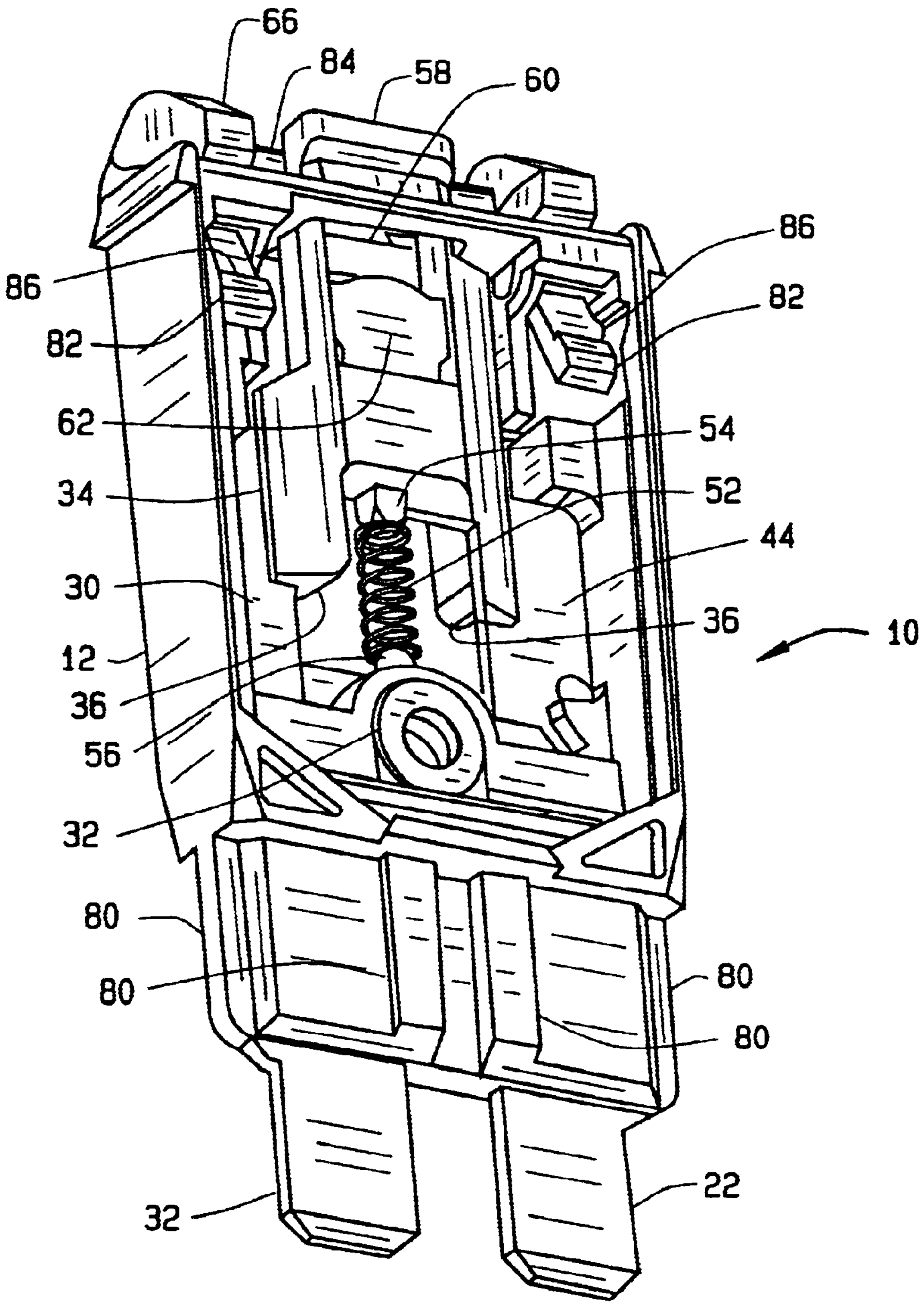
FIG. 5 is a perspective view of the circuit breaker shown in FIG. 1 with parts removed.

FIG. 5 is a perspective view of an illustrative embodiment of circuit breaker 10 with thermal material 14 (shown in FIGS. 1–4) and cover 64 (shown in FIG. 1) removed, and illustrating a placement of mechanism 34 and spring 52 within housing 12, and in which the benefits of the invention are demonstrated.

As described above, circuit breaker 10 includes housing 12, which is constructed of an injection molded plastic or other suitable material. Molded into housing 12 are a plurality of keys 80 which configure housing 12 and therefore circuit breaker 10 for insertion into a circuit (not shown).

Trip indicator/reset mechanism 34 is mounted within housing 12, and legs 36 are configured to engage and rest upon circuit path 30 and guide 44. Mechanism 34 is illustrated in a tripped position, as spring 52 is uncompressed and fiberglass insert 62 is in front of breaker contact 28 (shown in FIG. 1). Spring 52 provides a biasing force to slide mechanism 34 along circuit path 30 and guide 44 when breaker contacts 26 and 28 (shown in FIGS. 3 and 4) separate, thereby placing fiberglass insert 62 between breaker contacts 26 and 28. Indicating end 58 of mechanism 34 also is caused to extend further out of opening 60 molded into housing 12. To reset a tripped circuit breaker 10, force is applied to indicating end 58 of mechanism 34, compressing spring 52 and sliding mechanism 34 along circuit path 30 and guide 44, until fiberglass insert 62 is located below breaker contacts 26 and 28, which then again make contact and serve to restrain mechanism 34 and maintain spring 52 in a compressed position. Resetting circuit breaker 10 also causes indicating end 58 of mechanism 34 to partially recede into opening 60, providing a visual indication that breaker 10 is in a reset (not tripped) state.

Circuit breaker 10 further includes a manual tripping device 66. Manual tripping device 66 serves to manually trip breaker 10 by applying a mechanical force to thermal material 14 (shown in FIGS. 1–4), thus forcing thermal material 14 from the convex form to the concave form, causing contacts 26 and 28 to separate and allowing mechanism 34 to slide along circuit path 30 and guide 44 until fiberglass insert 62 assumes a position between breaker contacts 26 and 28.

In an exemplary embodiment, manual tripping device 66 is a molded plastic device and includes a pair of parallel leg members 82 which engage thermal material 14 as described above and a cross-member 84 to which is applied a force causing molded protrusions 86 on members 82 to engage thermal material 14. When the force is applied to cross member 84, a pivoting action of device 66 causes molded protrusions 86 on device 66 to engage thermal material 14, thereby causing breaker contacts 26 and 28 (shown in FIG. 1) to separate, and allowing mechanism 34 to move into a tripped position as previously described.

Figure 6:
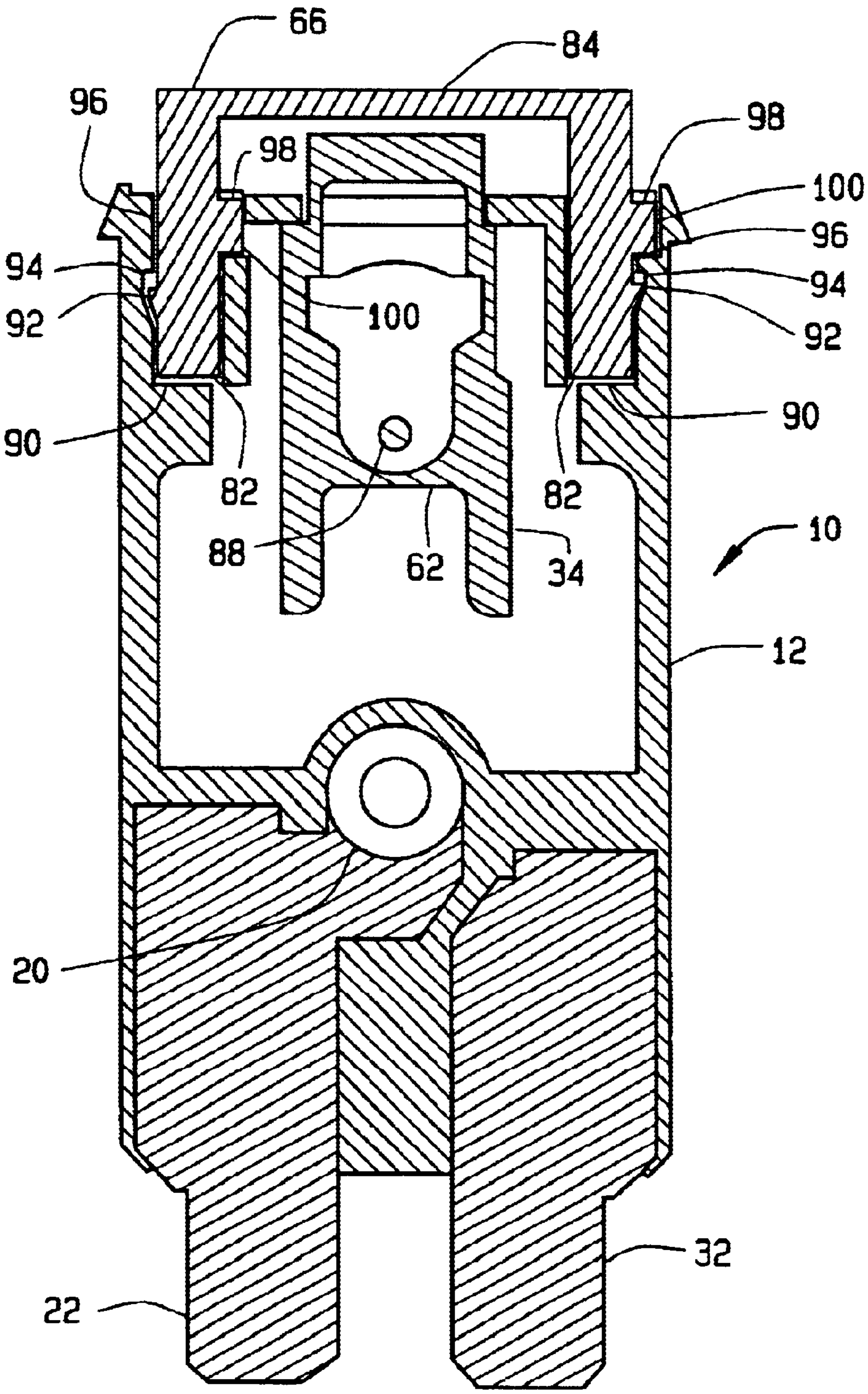
FIG. 6 is a cross-sectional view of the circuit breaker shown in FIG. 1.

FIG. 6 is a cross-sectional view of circuit breaker 10 further illustrating features of both breaker 10 and manual tripping device 66. Referring to first blade contact 22, the cross sectional view of circuit breaker 10 indicates the connection, described above in relation to FIG. 1, between contact 22 and cylindrical receptacle 20. In the embodiment shown, contact 22 and receptacle 20 appear as a single piece assembly. Further, attachment of fiberglass insert 62 to mechanism 34 is shown at connection point 88. Connection point 88 may be any of a number of known attaching methods, including, but not limited to, a molded post on mechanism 34 onto which a hole in fiberglass insert 62 is engaged, or a rivet inserted through openings in both mechanism 34 and fiberglass insert 62.

Referring to manual tripping device 66, device 66 is inserted into housing 12 into a plurality of molded slots 90, which are molded as part of production of housing 12. Members 82 of device 66 are inserted into molded slots 90. Upon insertion of members 82 a pair of angular projections 92 engage indentations 94 molded into housing 12 providing a snap fit mechanism to retain device 66 in place. Device 66, in one embodiment, is sufficiently flexible so as to allow some compression of members 82, thereby allowing angular projections 92 of device 66 to pass through non-indented portions 96 of molded slots 90. Further, device 66 includes molded semi-circular protrusions 98, which, when device 66 is inserted in place into housing 12 provide an axis of rotation, or pivot point, for device 66. The axis of rotation is provided as housing 12 includes molded stops 100 on which protrusions 98 rest. Molded slots 90 and indentations 94 are molded into housing 12 so as to allow members 82 of device 66 some freedom of movement about the axis of rotation thereby allowing molded protrusions 86 (shown in FIG. 5) to engage thermal material 14 (shown in FIGS. 1–4), as described above, when force is placed on cross-member 84.

Figure 7:
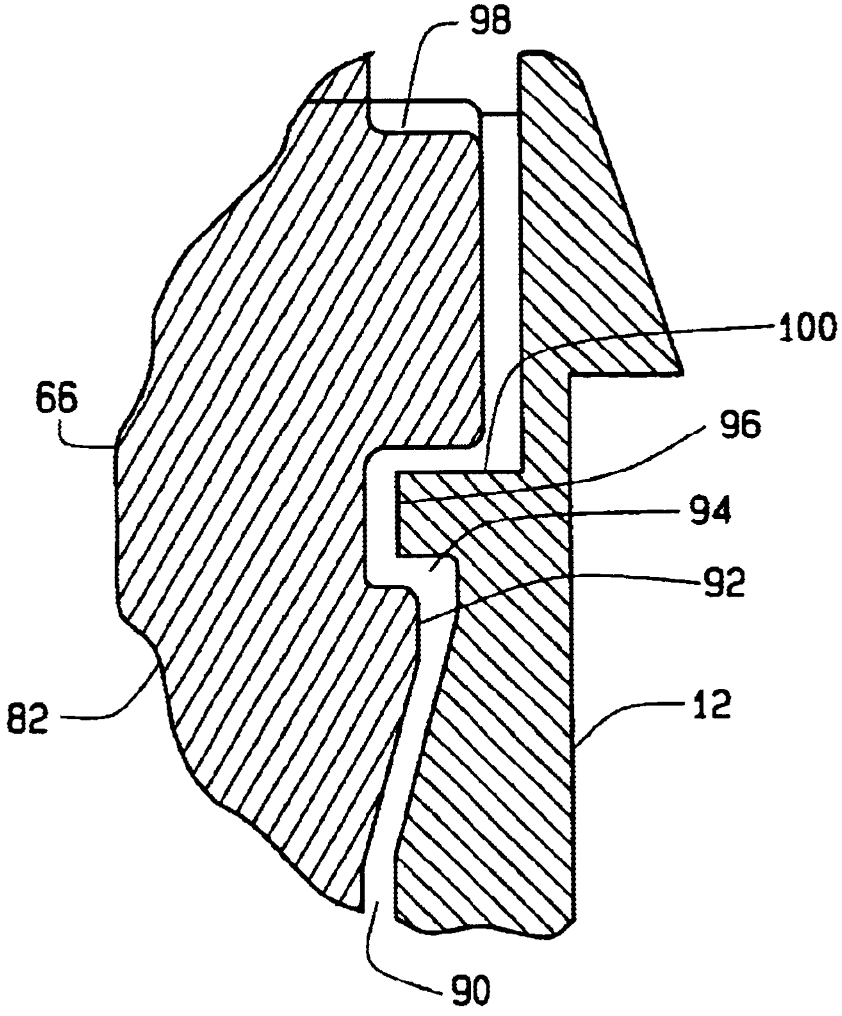
FIG. 7 is a magnified view of a portion of FIG. 6.

FIG. 7 is a detailed view of a portion of device 66 engaging a portion of housing 12. As described above members 82 of device 66 are inserted into molded slots 90. Upon insertion of members 82 angular projections 92 engage indentations 94 molded into housing 12 providing a retention mechanism which retain device 66 in position with snap-fit engagement. As also noted above, device 66 is flexible allowing angular projections 92 to pass non-indented portions 96 of molded slots 90. Further, molded semi-circular protrusions 98, provide an axis of rotation for device 66 when protrusions 98 come to rest on molded stops 100 on which protrusions 98 rest.

Figure 8:
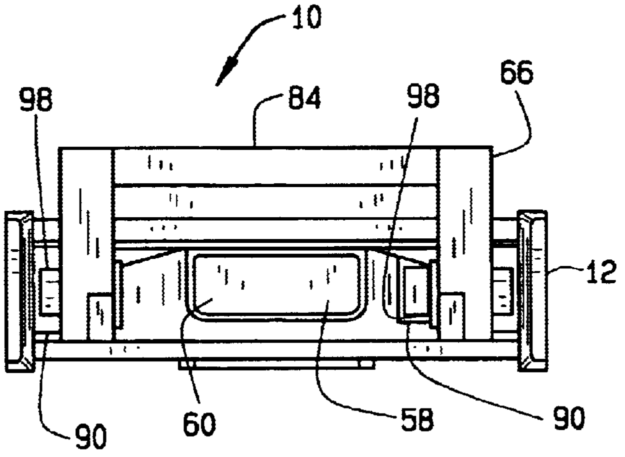
FIG. 8 is a top plan view of the circuit breaker shown in FIG. 1.

FIG. 8 is a top view of breaker 10 illustrating cross-member 84 of manual tripping device 66 and molded slots 90 of housing 12, into which members 82 (shown in FIGS. 6 and 7) are inserted. Protrusions 98 extend from members 82 of device 66 to provide the axis of rotation for device 66. Further, indicating end 58 of mechanism 34 extends through opening 60 in housing 12.

Figure 9:
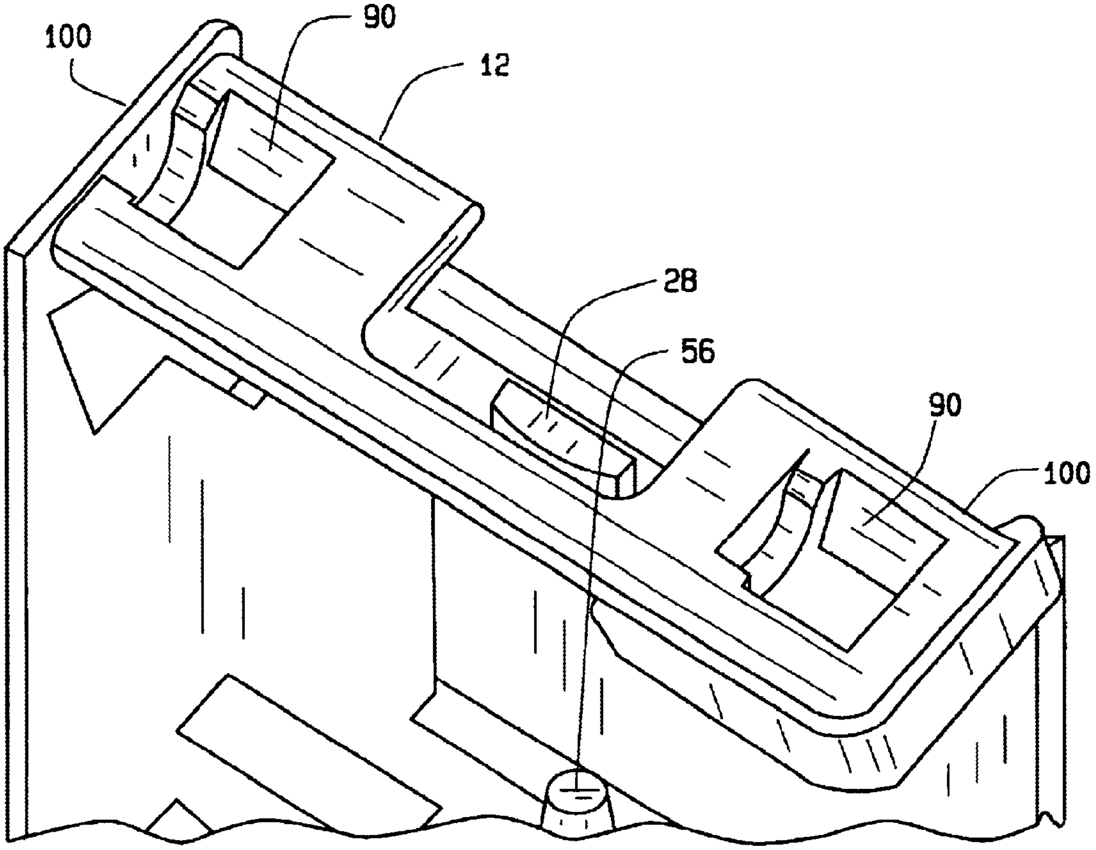
FIG. 9 is a perspective view of an upper portion of the circuit breaker shown in FIG. 1.

FIG. 9 is a perspective view of an upper portion of housing 12, which serves to illustrate insertion of manual tripping device 66 (shown in FIGS. 1, 5, 6 and 8). As described above, housing 12 includes molded slots 90 into which members 82 (shown in FIGS. 5 and 6) of device 66 are inserted. Also shown are molded stops 100 on which protrusions 98 (shown in FIGS. 6–8) of device 66 rest, to provide the axis of rotation, or pivot point.

Manual tripping device 66 provides a benefit over known manual tripping devices in that device 66 is not continuously mechanically or electrically attached to a current path. Further, unlike known circuit breakers employing manual trip devices, circuit breaker 10 configured with manual tripping device 66 simulates circuit breaker tripping action by separating contacts of the circuit breaker. Circuit breaker 10 is configured to separate breaker contacts by placing a force on thermal material 14, thereby changing its shape. Changing shape of thermal material 14 is a normal operation for circuit breaker 10. By providing a manual tripping device, such as device 66, which allows circuit breaker 10 to simulate normal operation, a circuit breaker is provided that eliminates additional latching devices of conventional circuit breakers.

Figure 10:
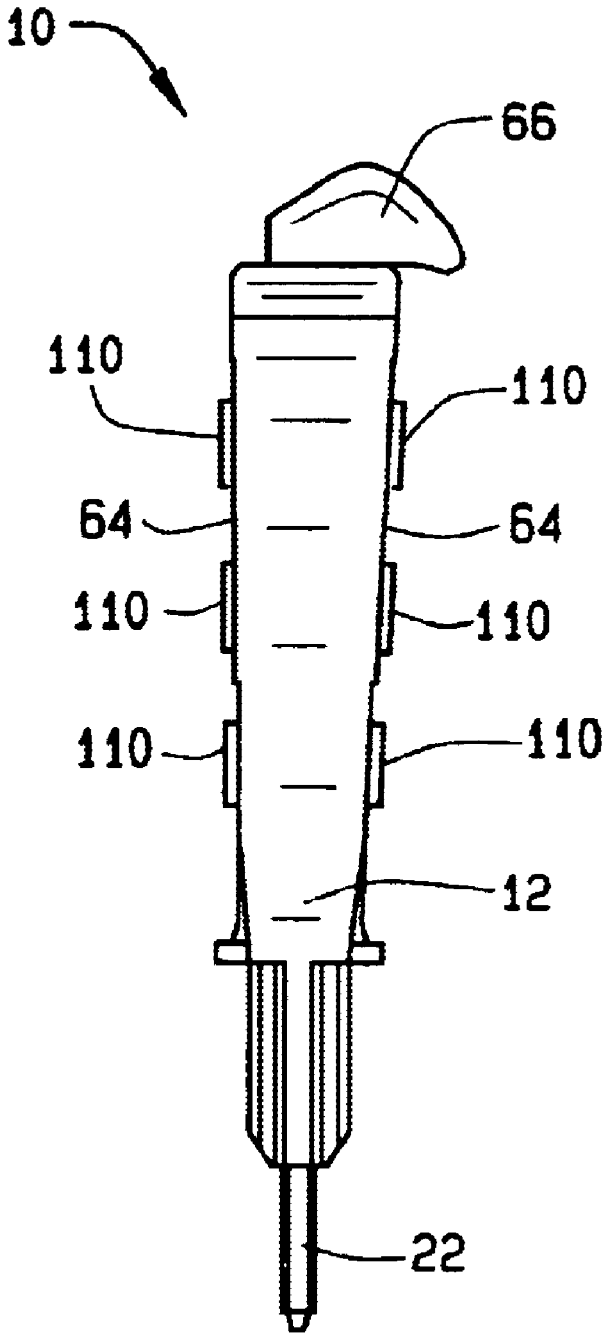
FIG. 10 is a side elevational assembled view of the circuit breaker shown in FIG. 1.

FIG. 10 illustrates circuit breaker 10 in an assembled state with blade terminal 22 extending from a lower periphery of housing 12 and manual tripping device 66 extending above an upper periphery of housing 12. Front and rear covers 64 each include a number of embossments 110 projecting outwardly therefrom. Embossments 12 stiffen covers 64 and provide increased structural strength and rigidity to circuit breaker 10 for demanding operating environments. It is recognized that in alternative embodiments of circuit breaker 10 varying numbers of embossments 110 may be employed in various sizes and shapes without departing from the scope of the instant invention.

Still further, while embossments 110 are believed to be advantageous for at least some applications of circuit breaker 10, it is contemplated that the benefits of the present invention may nonetheless be achieved in other applications without the presence of embossments 110. In other words, covers 64 may be flat in alternative embodiments while capably meeting circuit protection needs.

While the invention has been described in terms of various specific embodiments, those skilled in the art will recognize that the invention can be practiced with modification within the spirit and scope of the claims.

What is claimed is:

1. A circuit breaker comprising:

a nonconductive housing;

a first breaker contact within said housing;

a trigger element comprising a second breaker contact located within said housing, said trigger element thermally activated to separate said second breaker contact from said first breaker contact in an overcurrent condition;

a nonconductive reset mechanism located in said housing and configured for sliding actuation to prevent electrical connection between said first breaker contact and said second breaker contact after said trigger element has activated; and a manual trip element coupled to said housing, said manual trip element comprising parallel leg members and a cross member therebetween, said leg members pivotally mounted to said housing, said leg members activating said trigger element as said trip element is pivoted.

2. A circuit breaker in accordance with claim 1 wherein said reset mechanism is configured for substantially linear movement within said housing.

3. A circuit breaker in accordance with claim 1 wherein said reset mechanism is spring loaded.

4. A circuit breaker in accordance with claim 1 further comprising at least one terminal blade extending from said housing, said reset mechanism extending through an opening in said housing opposite said at least one terminal blade after said trigger element has activated.

5. A circuit breaker in accordance with claim 1, said housing comprising slots therein, each of said parallel leg members received in one of said slots.

6. A circuit breaker comprising:

a nonconductive housing a first breaker contact within said housing;

a trigger element comprising a second breaker contact located within said housing, said trigger element thermally activated to separate said second breaker contact from said first breaker contact in an overcurrent condition;

a nonconductive reset mechanism located in said housing and configured for sliding actuation to prevent electrical connection between said first breaker contact and said second breaker contact after said trigger element has activated; and a manual trip element comprising opposite legs pivotally mounted to said housing, said opposite legs contacting said trigger element and separating said first and second breaker contact when said trip element is pivoted.

7. A circuit breaker in accordance with claim 6 wherein said housing includes at least one guide therein, said reset mechanism comprises first and second legs configured for sliding actuation along said guide.

8. A circuit breaker in accordance with claim 7 wherein said sliding actuation is substantially linear.

9. A circuit breaker in accordance with claim 8 further comprising first and second blade terminals extending from said housing, said reset mechanism situated between and substantially aligned with said blade terminals.

10. A circuit breaker in accordance with claim 8 further comprising a bias element positioned between said housing and said reset mechanism, said bias element forcing said reset element between said first breaker contact and said second breaker contact when said trigger element is activated.

11. A circuit breaker in accordance with claim 10 wherein said housing comprises an opening located therethrough, said reset mechanism extending through said opening after said trigger element is activated.

12. A circuit breaker in accordance with claim 6 further wherein said manual trip element comprises a cross member extending between said legs.

13. A circuit breaker in accordance with claim 12 wherein said legs of said manual trip element are substantially parallel.

14. A circuit breaker comprising:

a nonconductive housing;

first and second terminal blades extending from said housing;

a first breaker contact within said housing and in electrical contact with said first blade terminal;

a trigger element comprising a second breaker contact located within said housing, said second breaker contact in electrical contact with said second blade terminal, said trigger element thermally activated to separate said second breaker contact from said first breaker contact in an overcurrent condition;

a reset element comprising opposite legs in sliding engagement with said first and second blade terminals and a nonconductive portion extending between said opposite legs, said nonconductive portion positionable between said first breaker contact and said second breaker contact to prevent electrical connection therebetween after said trigger element has activated; and a manual trip element comprising opposite legs and a cross member therebetween, said legs pivotally mounted to said housing, said legs contacting said trigger element and separating said first and second breaker contact when said manual trip element is pivoted.

15. A circuit breaker in accordance with claim 14, said housing comprising an opening therethrough, said reset element extending through said opening after said trigger element has activated.

16. A circuit breaker in accordance with claim 15 wherein said opening is located between said legs of said trip element.

17. A circuit breaker in accordance with claim 14 wherein said reset element is configured for substantially linear movement within said housing.

18. A circuit breaker in accordance with claim 17 further comprising a bias element engaged to said reset element.

19. A circuit breaker in accordance with claim 18, said bias element comprising a spring, said spring located between said blade terminals.

20. A circuit breaker in accordance with claim 14 wherein said housing comprises at least one cover, said cover comprising at least one embossment projecting therefrom.

* * * * *